United States Patent
Hageman et al.

(10) Patent No.: US 9,923,269 B1
(45) Date of Patent: Mar. 20, 2018

(54) PHASE POSITION VERIFICATION SYSTEM AND METHOD FOR AN ARRAY ANTENNA

(71) Applicants: Michael L. Hageman, Mount Vernon, IA (US); James B. West, Cedar Rapids, IA (US); Russell D. Wyse, Center Point, IA (US)

(72) Inventors: Michael L. Hageman, Mount Vernon, IA (US); James B. West, Cedar Rapids, IA (US); Russell D. Wyse, Center Point, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 108 days.

(21) Appl. No.: 14/788,360

(22) Filed: Jun. 30, 2015

(51) Int. Cl.
*H01Q 3/26* (2006.01)
*H01Q 3/36* (2006.01)
*G01R 25/00* (2006.01)

(52) U.S. Cl.
CPC ........... *H01Q 3/267* (2013.01); *G01R 25/005* (2013.01); *H01Q 3/36* (2013.01)

(58) Field of Classification Search
CPC ...... G01R 25/0005; G01R 25/04; H01Q 3/26; H01Q 3/2664; H01Q 3/267; H01Q 3/268236; H01Q 3/38; H01Q 3/385
See application file for complete search history.

(56) References Cited

U.S. PATENT DOCUMENTS

| | | | |
|---|---|---|---|
| 4,800,390 A | 1/1989 | Searle | |
| 4,870,374 A * | 9/1989 | Harris | H03C 3/40 332/145 |
| 5,013,979 A | 5/1991 | Birleson | |
| 5,063,529 A * | 11/1991 | Chapoton | H01Q 3/267 342/174 |
| 5,414,433 A | 5/1995 | Chang | |
| 5,592,179 A | 1/1997 | Windyka | |
| 5,680,141 A | 10/1997 | Didomenico et al. | |
| 5,721,556 A | 2/1998 | Goutzoulis | |
| 5,873,026 A | 2/1999 | Reames | |
| 6,081,241 A | 6/2000 | Josefsson et al. | |

(Continued)

FOREIGN PATENT DOCUMENTS

WO    WO-2007/023371 A1    3/2007

OTHER PUBLICATIONS

Non-Final Office Action on U.S. Appl. No. 14/300,074, dated Apr. 22, 2016, 20 pages.

(Continued)

*Primary Examiner* — Frank J McGue
*Assistant Examiner* — Daniel P Malley, Sr.
(74) *Attorney, Agent, or Firm* — Donna P. Suchy; Daniel M. Barbieri

(57) ABSTRACT

A system and method verifies phase shifter operation in an antenna array system. The system can include and the method can use a number of antenna elements, and a number of phase shifters. Each of the phase shifters is associated with the respective antenna element of the antenna elements and may include a power amplifier circuit. The system also can include and the method can also use a number of power sensors in communication with the phase shifters. Each of the phase shifters can be associated with a respective power sensor and the power sensor can be configured to detect power associated with the power amplifier circuit.

20 Claims, 9 Drawing Sheets

(56) References Cited

U.S. PATENT DOCUMENTS

| | | | |
|---|---|---|---|
| 6,133,868 A * | 10/2000 | Butler | H01Q 3/267 342/165 |
| 6,191,735 B1 | 2/2001 | Schineller | |
| 6,413,896 B1 | 7/2002 | Shimada et al. | |
| 6,531,935 B1 | 3/2003 | Russat et al. | |
| 6,989,788 B2 | 1/2006 | Marion et al. | |
| 7,808,798 B2 | 10/2010 | Cotte et al. | |
| 8,466,846 B1 | 6/2013 | Elsallal et al. | |
| 8,659,499 B1 | 2/2014 | Pluymers | |
| 8,903,342 B1 | 12/2014 | Wyse et al. | |
| 8,907,817 B1 | 12/2014 | Finley et al. | |
| 9,083,350 B1 | 7/2015 | Posner et al. | |
| 9,116,244 B1 | 8/2015 | West et al. | |
| 9,391,375 B1 | 7/2016 | Bales et al. | |
| 2002/0093453 A1 | 7/2002 | Vail et al. | |
| 2003/0189515 A1 | 10/2003 | Jacomb-Hood et al. | |
| 2005/0270219 A1 | 12/2005 | Dwelly et al. | |
| 2005/0275585 A1 | 12/2005 | Shima et al. | |
| 2006/0068707 A1 * | 3/2006 | Greeley | H01Q 3/26 455/42 |
| 2006/0164284 A1 | 7/2006 | Pauplis et al. | |
| 2008/0306723 A1 | 12/2008 | De Ambroggi et al. | |
| 2009/0134940 A1 * | 5/2009 | Nishizawa | H03F 1/34 330/149 |
| 2009/0231197 A1 * | 9/2009 | Richards | H01Q 3/2682 342/377 |
| 2009/0251357 A1 | 10/2009 | Margomenos | |
| 2009/0251368 A1 * | 10/2009 | McCune, Jr. | H01Q 3/38 342/368 |
| 2010/0117917 A1 | 5/2010 | Kindt et al. | |
| 2010/0259446 A1 * | 10/2010 | Corman | H01Q 3/26 342/373 |
| 2011/0109507 A1 | 5/2011 | Warnick | |
| 2011/0122011 A1 | 5/2011 | Ryden et al. | |
| 2011/0299456 A1 | 12/2011 | Schmidt et al. | |
| 2011/0305258 A1 | 12/2011 | Boutchich et al. | |
| 2012/0277590 A1 | 11/2012 | Song et al. | |
| 2012/0326781 A1 | 12/2012 | Mori et al. | |
| 2013/0235962 A1 * | 9/2013 | O'Keefe | H01Q 3/267 375/371 |

OTHER PUBLICATIONS

Non-Final Office Action on U.S. Appl. No. 14/849,491, dated May 24, 2016, 11 pages.
U.S. Appl. No. 13/714,209, filed Dec. 13, 2012, Wyse et al.
U.S. Appl. No. 13/837,934, filed Mar. 15, 2013, West et al.
U.S. Appl. No. 14/300,021, filed Jun. 9, 2014, West et al.
U.S. Appl. No. 14/300,055, filed Jun. 9, 2014, West et al.
U.S. Appl. No. 14/300,074, filed Jun. 9, 2014, West et al.
Carchon et al. "Thin Film Technologies for Millimeter-Wave Passives and Antenna Integration" imec EuMW 2008 38th European Microwave Conference, pp. 1-46.
Final Office Action on U.S. Appl. No. 14/300,074, dated Sep. 27, 2016, 21 pages.
Final Office Action on U.S. Appl. No. 14/849,491, dated Oct. 21, 2016, 5 pages.
Kraus, J.D. et al., Antennas for All Applications, Third Edition, McGraw-Hill Higher Education, p. 109, 2002.
Molisch, A.F. et al., Time Hopping and Frequency Hopping in Ultrawideband Systems, IEEE Pacific Rim Conference on Communications, Computers and Signal Processing, p. 541-544, 2003.
Non-Final Office Action on U.S. Appl. No. 14/300,021, dated Mar. 21, 2017, 19 pages.
Non-Final Office Action on 14/300,055, dated Sep. 27, 2016, 7 pages.
Notice of Allowance on U.S. Appl. No. 14/300,055, dated Apr. 5, 2017, 7 pages.
Notice of Allowance on U.S. Appl. No. 14/300,074, dated Jan. 12, 2017, 9 pages.
Notice of Allowance on U.S. Appl. No. 14/849,491, dated Jan. 13, 2017, 5 pages.
Buffer 2. (2011). The American Heritage Dictionary of the English Language (5th ed.). Boston, MA: Houghton Mifflin. Retrieved from http://search.credoreference.com/content/entry/hmdictenglang/buffer_2/0.
Final Office Action for U.S. Appl. No. 14/300,021 dated Jul. 10, 2017. 23 pages.
Non-Final Office Action for U.S. Appl. No. 14/300,021 dated Nov. 24, 2017. 22 pages.

* cited by examiner

PHASE POSITION VERIFICATION SYSTEM AND METHOD FOR AN ARRAY ANTENNA

CROSS-REFERENCE TO RELATED PATENT APPLICATIONS

This application is related to U.S. application Ser. No. 14/300,021, filed on Jun. 6, 2014 West et al., U.S. application Ser. No. 14/300,074, filed on Jun. 6, 2014 by West et al., and U.S. application Ser. No. 14/300,055, filed on Jun. 6, 2014 by West et el., all assigned to the Assignee of the present application and hereby incorporated by reference in their entireties.

BACKGROUND

The present disclosure relates generally to the field of antenna systems. More specifically, the present disclosure relates generally to the field of antenna arrays including but not limited to, phased array antenna systems or electronically scanned array (ESA) antenna systems, such as active electronically scanned array (AESA) antenna systems.

Antenna arrays are utilized with transceivers. As used in this application, the term transceiver refers to an electronic device embodied as a transmitter, a receiver or a transmitter/receiver. The antenna array can be steered by using variable phase shifters coupled to respective antenna elements in the antenna array to direct the antenna at a pointing angle. The phase shifters can be variable phase shifters which provide a set of phase delays in response to a set of commands to direct the antenna to appropriate pointing angles without physically moving the antenna elements.

Validating beam parameters can be important in radar systems, ground communication systems, satellite communication systems, and sensors. Certain applications have certification requirements that mandate that several beam parameters be verified during operation. Phase errors can have deleterious effects on beam parameters. Monitoring beam patterns using conventional techniques adds to the size, cost, power, and weight of transceiver systems. Such conventional techniques often require measurement circuitry at each element and require a radio frequency reference source.

Thus, there is a need for an in-situ method of monitoring an antenna system which does not add to the size, cost, power, and/or weight of the transceiver system. Further, there is a need for a flight critical AESA-based system that uses monitoring for achieving increased mean time between failures, dispatchibility, reliability, and availability. Further still, there is a need for a robust AESA-based or other phased array antenna-based system with in-situ beam pattern monitoring. Further still, there is a need for an AESA-based or other phased array antenna-based system with real time beam pattern monitoring. Further still, there is a need for an AESA-based or other phased array antenna-based system with transmit/received excitation phase monitoring (e.g., at the radiation aperture) that ensures radiation performance and enables self-calibration, and/or self-healing. Yet further still, there is a need for an AESA-based or other phased array antenna-based system with phase monitoring.

It would be desirable to provide a system and/or method that provides one or more of these or other advantageous features. Other features and advantages will be made apparent from the present specification. The teachings disclosed extend to those embodiments that fall within the scope of the appended claims, regardless of whether they accomplish one or more of the aforementioned needs.

SUMMARY

In one aspect, the inventive concepts disclosed herein are directed to a system and method that verifies phase shifter operation in an electronically steerable antenna system. The system can include and the method can use a number of antenna elements, and a number of phase shifters. Each of the phase shifters is associated with the respective antenna element of the antenna elements and includes a power amplifier circuit. The system also can include and the method can also use a number of power sensors in communication with the phase shifters. Each of the phase shifters can be associated with a respective power sensor and the power sensor can be configured to detect power associated with the power amplifier circuit.

In another aspect, the inventive concepts disclosed herein are directed to an electronically steerable antenna system. The system includes a number of antenna elements, and a number of phase shifters. Each of the phase shifters is associated with the respective antenna element of the antenna elements and includes a power amplifier circuit. The system also includes a number of power sensors in communication with the phase shifters. Each of the phase shifters can be associated with a respective power sensor and the power sensor can be configured to detect power associated with the power amplifier circuit. The system also includes a control circuit for calculating a phase parameter associated with each phase shifter using the power sensor.

In yet another aspect the inventive concepts disclosed herein are directed to a method of verifying phase associated with an antenna element in an electronically scanned antennae array. The method includes providing a phase shift command to a phase shifter associated with the antenna element, providing power to a first amplifier channel in accordance with the phase shift command, and measuring first power provided to the antenna element using the first amplifier channel with a power sensor integrated with the phase shifter. The method also includes providing power to a second amplifier channel in accordance with the phase shift command, measuring second power provided to the antenna element using the second amplifier channel or using both the first amplifier channel and the second amplifier with the power sensor, and determining a phase parameter from the first power parameter and the second power parameter to verify phase associated with the antenna element.

In still another aspect, the inventive concepts disclosed herein are directed to a method of verifying phase shifter operation associated with an antenna element in an electronically scanned antennae array. The method includes measuring first power provided to the antenna element using a first amplifier channel without a second amplifier channel using a plurality of first phase shift commands for the first amplifier channel. The first power is measured with a power sensor integrated with the phase shifter. The method also includes measuring second power provided to the antenna element using the second amplifier channel without the first amplifier channel using a plurality of second phase shift commands for the second amplifier channel. The second power is measured with the power sensor. The method also includes comparing the first power to the second power across a spectrum of the first phase shift commands and the second phase shift commands to verify phase shifter operation.

In another aspect, the inventive concepts disclosed herein are directed to a system for verifying phase in an antenna array. The system includes a verification module receiving power parameters associated with phase shifters associated with the antenna array and using the power parameters to verify the phase. The power parameters are measured at each antenna element of the antenna phase array with a respective sensor integrated with the respective phase shifter.

BRIEF DESCRIPTION OF THE DRAWINGS

Embodiments of the inventive concepts disclosed herein will become more fully understood from the following detailed description, taken in conjunction with the accompanying drawings, wherein like reference numerals refer to like elements, in which.

DETAILED DESCRIPTION

Figure 1:
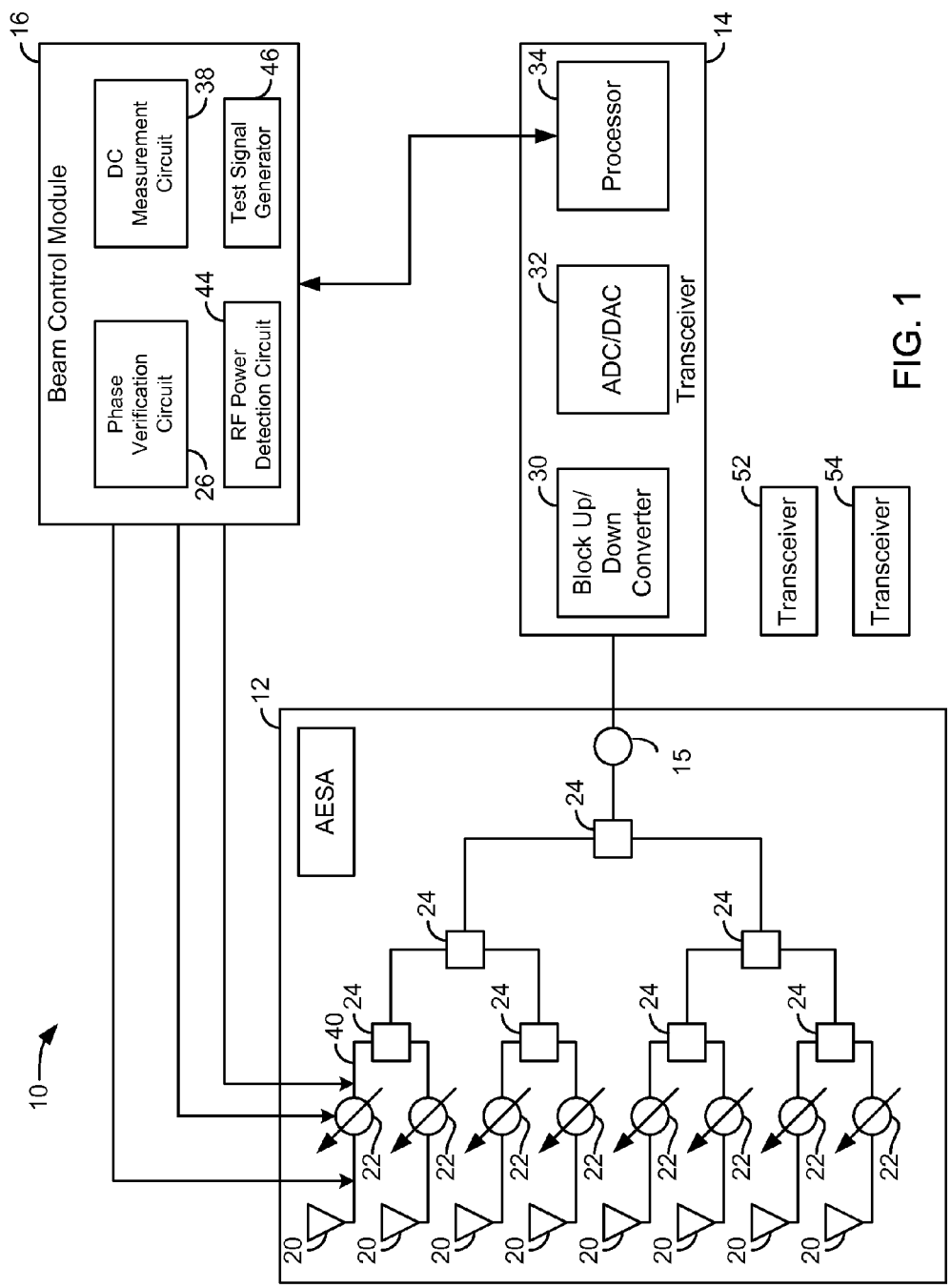
FIG. 1 is a general block diagram of a transceiver, an antenna system including a set of phase shifters, and a beam control module including a phase verification circuit in accordance with some embodiments of the inventive concepts disclosed herein.

Before describing in detail embodiments of the inventive concepts disclosed herein, it should be observed that the inventive concepts disclosed herein include, but are not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the exemplary diagrams, but should be construed in accordance with the language in the claims.

Referring generally to the figures, a transceiver and an antenna system is shown and described that may be used in radar, sensor and communications systems. The transceiver and antenna system can utilize antenna arrays (e.g., electronically steerable antenna arrays). For example, the systems and methods described can be utilized in communication, sensing and/or radar systems, such as, military radar systems or weather radar systems, electronic intelligence (ELINT) receivers, electronic counter measure (ECM) systems, electronic support measure (ESM) systems, targeting systems or other systems. In some embodiments, the systems and methods are utilized to provide an ultra-wide band (UWB) system. The steerable antenna arrays can include but are not limited to phased-array antenna systems, electronically scanned array antenna systems, or electronically scanned array (ESA) antenna systems, such as active electronically-scanned array (AESA) antenna systems.

In some embodiments, phase and/or amplitude sensing of radio frequency excitations at the aperture ensure real time radiation performance monitoring which enables self-calibration and self-healing of AESA systems. In some embodiments, the phase and amplitude of each radiating element (e.g., antenna element) is verified which allows the beam formed in space to be verified due to the physics of the ASEA. In some embodiments, integrated hardware for radio frequency and direct current power measurements are advantageously employed to infer the phase of each phase shifting element, thereby reducing development time and size, weight, cost, and power, eliminating performance degradation from the addition of measurement elements.

With reference to FIG. 1, a system 10 includes an antenna system 12, a transceiver 14, and a beam control module 16. The system 10 operates in a receive mode, transceiver mode or a transmit mode in some embodiments. The beam control module 16 can be provided within the antenna system 12, the transceiver 14, or as a discrete system. In some embodiments, parts of the beam control module 16 are integrated with the antenna system 12 and other parts of the beam control module 16 are integrated with the transceiver 12.

The system 10 can be or can be part of a sensing system, radar system, and communication system. In some embodiments, the system 10 can be part of an electronic intelligence (ELINT) receiver, an electronic countermeasure (ECM) system, a weather radar system, an electronic support measure (ESM) system, and/or hybrids thereof.

In some embodiments, the system 10 can employ multichip modules discussed in U.S. application Ser. No. 13/760,964 filed Feb. 6, 2013, Ser. No. 13/781,449, filed Feb. 28, 2013, and Ser. No. 13/837,934 filed Mar. 15, 2013, all of which are incorporated herein by reference in their entireties. In some embodiments, the system 10 can include components described in U.S. application Ser. No. 13/714,209 filed Dec. 13, 2012 and Ser. No. 13/737,777 filed Jan. 9, 2013, both incorporated herein by reference in their entireties.

The antenna system 12 can be a two-dimensional array or a single dimensional array in some embodiments. The antenna system 12 is utilized to point electronically at angles in one-dimensional or two-dimensional space in some embodiments. For example, beams may be aimed from an antenna system (e.g., an AESA antenna) by emitting waves that interfere constructively at certain angles in front of the antenna system 12. The antenna system 12 includes various components including apertures, power amplifiers, low noise amplifiers, phase shifters, transmit/receive switches, temperature sensing equipment, radio frequency (RF) power and phase delay sensing components, digital control and a beam steering computer in some embodiments. In some embodiments, the two-dimensional array or a single dimensional array of the antenna system 12 is circular, cylindrical, spherical, etc. and can be an arbitrarily curved surface, conformal to a vehicle surface, etc.

The antenna system 12 can be embodied as a Balanced Antipodal Vivaldi Array (BAVA) aperture, or other antenna system in certain embodiments. In some embodiments, array elements 20 are embodied as a dual polarization array, such as, the array shown in U.S. Pat. No. 8,466,846. U.S. Pat. No. 8,466,846 is incorporated herein by reference in its entirety.

The antenna system 12 includes an array of antenna elements 20, an array of phase shifters 22, radio frequency power detection circuit 44, and a set of power dividers 24. In some embodiments, each of the antenna elements 20 is associated with a respective phase shifter 22. The antenna system 12 can be a two-dimensional array, or a single dimensional array. The phase shifters 22 are controlled by the beam control module 16 which includes a phase verification circuit 26, a direct current measurement circuit 38, a radio frequency power detection circuit 44, and a phase verification circuit 36. Radio frequency amplifiers can be provided before and after the phase shifters 22 in some embodiments.

The power dividers 24 can be arranged in various fashions to communicate signals between the elements 20 and transceiver 14. The power dividers 24 are power splitters or directional couplers in some embodiments. The power dividers 24 are passive elements in some embodiments. The antenna system 12 can include the components described in U.S. application Ser. No. 14/300,021, filed on Jun. 6, 2014 West et al.,) U.S. application Ser. No. 14/300,074, filed on Jun. 6, 2014 by West et al., and U.S. application Ser. No. 14/300,055, filed on Jun. 6, 2014 by West el.

The phase shifters 22 can effect a set of phase shifts or phase delays so that appropriate constructive interference is obtained. A set of control signals or commands can be provided from the beam control module 16 to control inputs on the phase shifters 22. The control commands set the appropriate phase shifts for the phase shifters 22 to point the antenna system 12 at a pointing angle.

The transceiver 14 is provided on one or more RF integrated circuits, or modules in some embodiments. The transceiver 14 includes a block up/down converter 30, an analog-to-digital converter/digital-to-analog converter circuit 32, and an operational processor 34. Signals are transmitted to the antenna system 12 and received from the antenna system 12 through the block up/down converter 30. The block up/down converter 30 up converts transmitted signals from the converter circuit 32 and down converts signals received from the antenna system 12 in some embodiments. Signals for transmission from the operational processor 34 are converted to analog signals in the converter circuit 32 for the converter 30 in some embodiments. Received signals from the converter 30 are converted to digital signals in the converter circuit 32 for the operational processor 34 in some embodiments.

The transceiver 14 can be a receiver only, transmitter only, or both a transmitter/receiver. The transceiver 14 can be embodied as a hard wired circuit, ASIC, programmable logic device, operational processor or combination thereof. The transceiver 14 is coupled to antenna system 12 at a node 15 between converter 30 one of the dividers 24.

The beam control module 16 can be a software module operating on a computer platform or the operational processor 34, an ASIC, a programmable logic device, a hardware circuitry, or a mixture of thereof. The beam control module 16 provides a set of phase shift commands to the phase shifters 22 to effect the pointing angle in some embodiments. In some embodiments, the set of phase shift commands are provided in response to a beam pointing angle parameter and a frequency parameter. In some embodiments, the set of phase shift commands are provided in response to a beam pointing angle parameter, an environmental parameter, and a frequency parameter. The beam control module 16 includes a phase verification circuit 36, a direct current measurement circuit 38, and a radio frequency power detection circuit 44.

A direct current measurement circuit 38 measures power used in the phase shifter 22 to infer an amount of power provided by the phase shifter 22. The direct current measurement circuit 38 can be integrated with the phase shifters 22 or can be distinct components in some embodiments. In some embodiments, the direct current measurement circuit 38 can be an integrated circuit component configured to monitor current provided to amplifying components in the phase shifter 22. The direct current measurement circuit 38 is partially located in the beam control module 16, the phase shifter 22, or both in some embodiments. The term current measurement circuit as used herein refers to an electronic component capable of detecting a level of power, current, or voltage associated with a signal.

The radio frequency power detection circuit 44 can be integrated with the phase shifters 22 or can be distinct components in some embodiments. The radio frequency power detection circuit 44 can measure the power at respective antenna elements 20 and provide a measurement signal or data to the beam control module 16 in some embodiments. In some embodiments, the radio frequency power detection circuit 44 can be a radio frequency coupled device coupled at a location associated with its respective antenna element 20 in some embodiments. (e.g., before or after the phase shifters 22). The radio frequency power detection circuit 44 is partially located in the beam control module 16, the phase detector 22, or both in some embodiments. The radio frequency power detection circuit 44 can be tunable to the frequency associated with its respective antenna element 20 to provide a signal or data indicative of the power of the radio frequency signal at its respective antenna element 20 in some embodiments. The radio frequency power detection circuit 44 include an amplifier indirectly coupled to a conductor supplying the antenna element 20 within the radio frequency integrated circuit associated with the phase detector 22. The term power detector as used herein refers to an electronic component capable of detecting a level of power, current, or voltage associated with a signal. Power levels can be derived from current and voltage levels according to circuit principles.

The phase verification circuit 36 can measure the phase associated with each of the antenna elements 20 and the phase detectors 22 and compare the measured phase to the phase shift command to determine a phase error. The comparison can be made by subtracting the measured phase by the phase associated with the phase command. The phase error can be used by beam control module 16 to adjust the phase shift command to reduce the error in some embodiments. The phase error can also be reported as part of a maintenance report in some embodiments.

The phase shift commands can be stored in memory and selected in response to the beam pointing angle parameter and at least one of the environmental parameter and the frequency parameter. In some embodiments, a look-up table can be used to provide a set of phase shift commands in response to the beam pointing angle, the frequency parameter, the phase error and/or the environmental parameter. Alternatively, a bias can be applied to the phase shift commands in response to the phase error, environmental parameter or the frequency.

The phase verification circuit 36 verifies phase and/or phase shifter operations according to several techniques in some embodiments. The phase verification circuit 36 verifies phase using power signals from one or both of the radio frequency power detection circuit 44 or the direct current measurement circuit 38. In some embodiments, the phase verification circuit 36 uses power signals from both the radio frequency power detection circuit 44 and the direct current measurement circuit 38 to verify phase and the quadrant of the phase. In some embodiments, the phase verification circuit 36 verifies phase shifter operation using power signals from one or both of the radio frequency power detection circuit 44 or the direct current measurement circuit 38 across a spectrum of phase control inputs.

In some embodiments, a test signal generator 46 provides a radio frequency signal between the antenna element 20 and the phase shifter 22. The phase verification circuit 36 measures power using the radio frequency power detection circuit 44 to determine the phase shift provided by the phase shifter 22. The test signal generator 46 can be used when received signals are not of sufficient magnitude to adequately measure in the receive mode. The test signal generator 46 can also be used in the transmit mode.

Figure 2A:
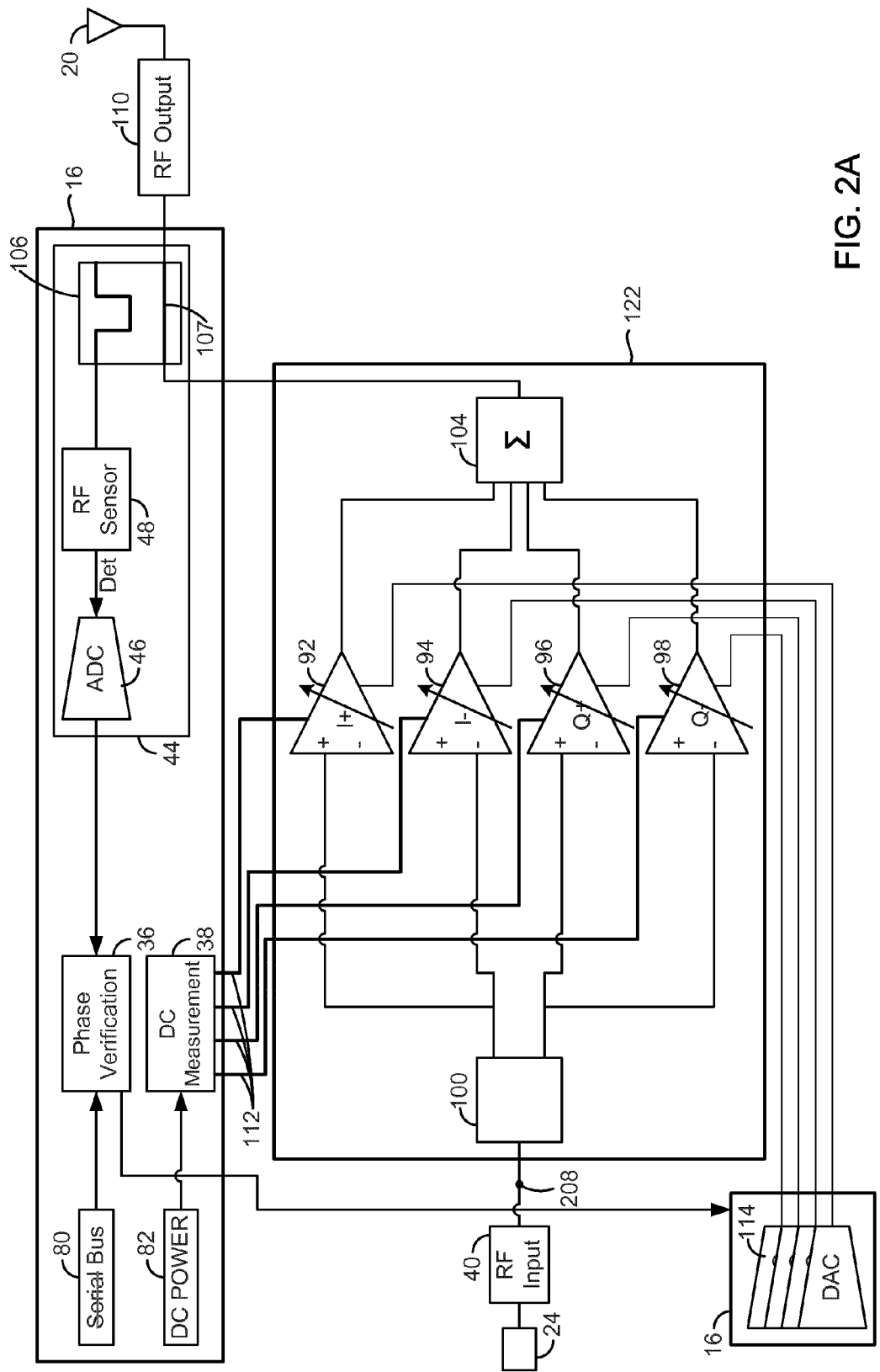
FIG. 2A is a more detailed block diagram of one of the phase shifters illustrated in FIG. 1 and the phase verification circuit illustrated in FIG. 1 in a transit mode in accordance with some embodiments of the inventive concepts disclosed herein.
Figure 2B:
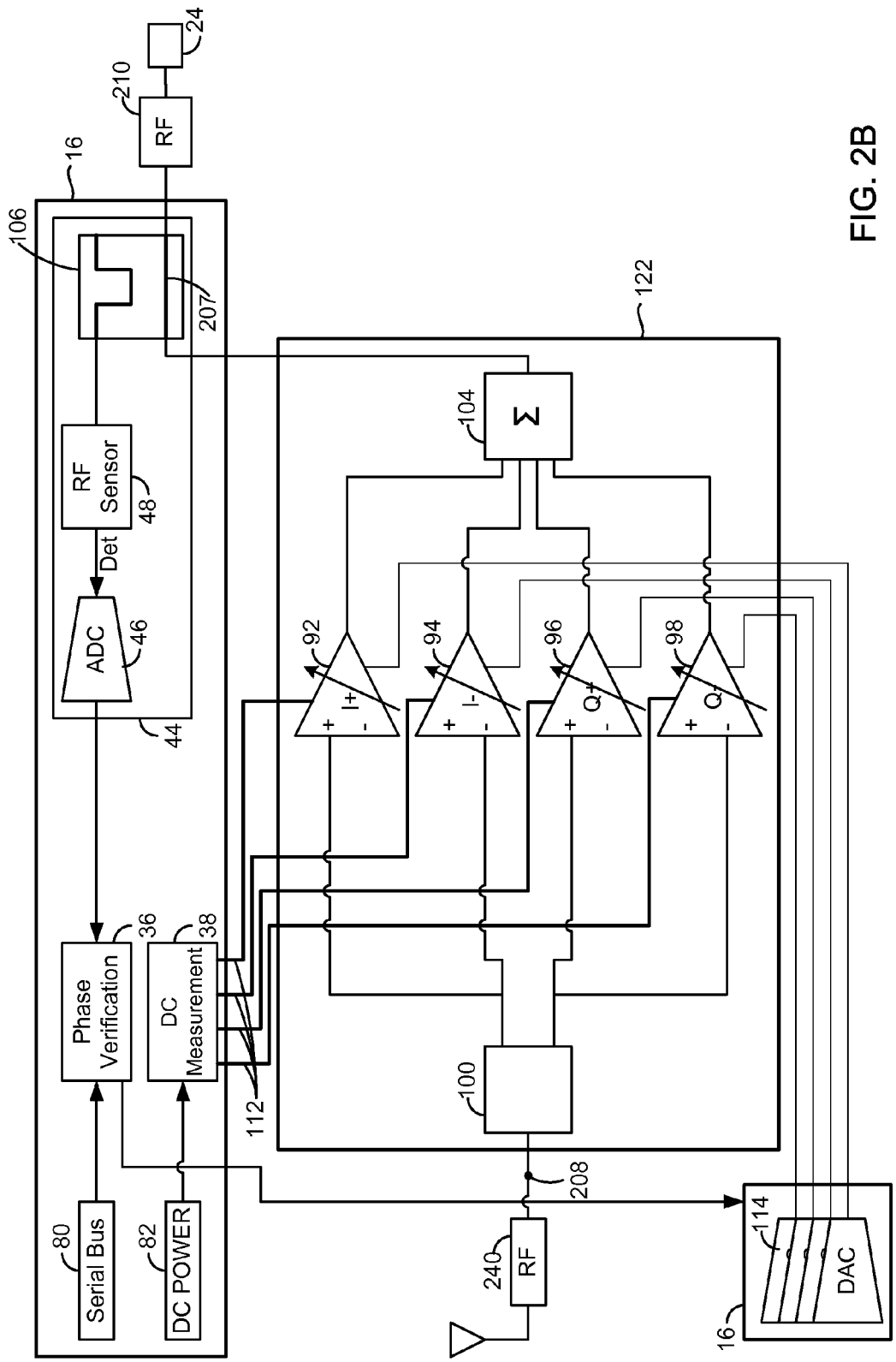
FIG. 2B is a more detailed block diagram of one of the phase shifters illustrated in FIG. 1 and the phase verification circuit illustrated in FIG. 1 in a received mode in accordance with some embodiments of the inventive concepts disclosed herein.

With reference to FIGS. 2A and 2B, a phase shifter 122 can be used as the phase shifter 22 of system 10 (FIG. 1). The phase shifter 122 is coupled to the beam steering module 16 which includes radio frequency power detector circuit 44, phase verification circuit 36, direct current measurement circuit 38 and a set of digital to analog converters 114 in some embodiments. In some embodiments, the phase verification circuit 36, the direct current measurement circuit 38, the serial bus 80, the radio frequency power detector circuit 44, and the direct current power bus 82 are part of the phase shifter 122.

FIG. 2A shows the phase shifter 122 for operation in a transmit mode while FIG. 2B shows a phase shifter 122 for operation in receive mode. Transmit modes and receive modes can be implemented using receiver switches or using separate circuits.

The beam steering module 16 can be part of the transceiver 14 or can be discrete components in some embodiments. The phase verification circuit 36 and the direct current measurement circuit 38 can be embodied as a computer platform (e.g., an operational processor and memory) configured via software. Alternatively, hard wired circuitry, ASICS, programmable logic devices, software, and mixtures thereof can be used to embody the phase verification circuit 36, the direct current measurement circuit 38, and the radio frequency power detector circuit 44.

The phase shifter 122 includes one or amplifiers, such as a positive in-phase (I) amplifier 92, a negative in-phase amplifier 94, a positive quadrature (Q) phase amplifier 96, and a negative quadrature amplifier 98, a phase delay element 100, and a summer 104 in some embodiments. In some embodiments, the phase delay element 100 provides an 80 to 100 degree phase delay for the quadrature channel associated with the positive quadrature phase amplifier 96 and the negative quadrature amplifier 98 and no phase delay for the in-phase channel associated with the positive in-phase amplifier 92 and the negative in-phase amplifier 94. The phase delay can be 90 degrees; however, other phase delay values can be utilized without departing from the inventive concepts disclosed herein.

A non-inverting input of the positive in-phase amplifier 92 receives the radio frequency signal from a radio frequency input 40, and an inverting input of the negative in-phase amplifier 94 receives the radio frequency signal from the radio frequency input 40 in some embodiments. A non-inverting input of the positive quadrature amplifier 96 receives the radio frequency signal from the radio frequency input 40 via the phase delay element 100, and an inverting input of the negative quadrature amplifier 98 receives the radio frequency signal from the radio frequency input 40 via the phase delay element 100 in some embodiments. The outputs of the positive in-phase amplifier 92, the negative in-phase amplifier 94, the positive quadrature phase amplifier 96, and the negative quadrature amplifier 98 are provided to the summer 104 for provision as a combined signal at a conductor 107. The summer 104 is a passive summer or an active summer. The radio frequency input 40 can by a pin or terminal for the radio frequency integrated circuit associated with the phase shifter 122.

The digital-to-analog converters 114 provide gain control signals to the positive in-phase amplifier 92, the negative in-phase amplifier 94, the positive quadrature phase amplifier 96, and the negative quadrature amplifier 98 to effect the phase of the radio frequency signals provided at the radio frequency output 110 in accordance with the phase command. Although in-phase and quadrature channels are discussed herein, other channel types can be utilized. In some embodiments, direct current beam control signals, one for each channel, are provided to a selected pair of positive in-phase amplifier 92, negative in-phase amplifier 94, positive quadrature phase amplifier 96, and negative quadrature amplifier 98.

The positive in-phase amplifier 92, the negative in-phase amplifier 94, the positive quadrature phase amplifier 96, and the negative quadrature amplifier 98 are variable gain control radio frequency amplifiers in some embodiments. The positive in-phase amplifier 92, the negative in-phase amplifier 94, the positive quadrature phase amplifier 96, and the negative quadrature amplifier 98 can cooperate to provide the radio frequency signal with a phase parameter in one of all four quadrants (e.g., 0-360 degrees).

Power from the direct current power bus 82 for each of the positive in-phase amplifier 92, the negative in-phase amplifier 94, the positive quadrature phase amplifier 96, and the negative quadrature amplifier 98 can be individually monitored using the direct current measurement circuit 38. The direct current measurement circuit 38 can monitor power provided to each of the positive in-phase amplifier 92, the negative in-phase amplifier 94, the positive quadrature phase amplifier 96, and the negative quadrature amplifier 98. The direct current measurement circuit 38 provides an indication of such power or current to the phase verification circuit 36. Voltage can be sensed across respective bias element associated with respective conductors 112 to determine power provided to the positive in-phase amplifier 92, the negative in-phase amplifier 94, the positive quadrature phase amplifier 96, and the negative quadrature amplifier 98 in some embodiments. In some embodiments, other types of power sensors are utilized. In some embodiments, the direct current power bus 82 is a pin or terminal for the radio frequency integrated circuit associated with the phase shifter 122.

In some embodiments, power provided in the quadrature channel and the in-phase channel is estimated based upon the current measured by the direct current measurement circuit 38. The direct current measurement circuit 38 or the power verification circuit 36 can include a look-up table defining phase channel power levels based upon sensed current. The data for the look up table is empirically determined in some embodiments. In some embodiments, the look up table provides 1 to 1 mapping for phase control input commands, direct current sensed by the direct current measurement circuit 38, and radio frequency phase.

The radio frequency power detector 44 includes an analog-to-digital convert 46, a radio frequency power sensor 48, and a radio frequency coupling 106 in some embodiments. The radio frequency power sensor 48 detects a sense signal associated with the current, voltage or power at the radio frequency output 110 via the radio frequency coupling 106 associated with the conductor 107 (FIG. 2A) between the radio frequency output 110 and the phase shifter 122 or a conductor 207 (FIG. 2B) between the radio frequency output 210 and the phase shifter 122. In some embodiments, a node 108 (FIG. 2A) or a node 208 (FIG. 2B) can be coupled to the radio frequency power sensor 48. The radio frequency power sensor 48 provides the sense signal to the analog-to-digital converter 46 and is a power measurement circuit having wide dynamic range in some embodiments. The conductors 107 and 207 are an integrated circuit path between a pin and terminal (e.g., the radio frequency output 110 or 210) of the integrated circuit associated with the phase shifter 122 in some embodiments. The radio frequency power sensor 48 provides the sense signal to the analog-to-digital converter 46.

The radio frequency input 40 is a pin or terminal for the radio frequency integrated circuit associated with the phase shifter 122 and is coupled to one of the splitters 24 (FIG. 1) in some embodiments. The radio frequency input 240 in FIG. 2B is coupled to the antenna element 20, and the radio frequency output 210 in FIG. 2B is coupled to the splitter 24 in some embodiments.

The digital-to-analog converters 114 provide gain control signals to the positive in-phase amplifier 92, the negative in-phase amplifier 94, the positive quadrature phase amplifier 96, and the negative quadrature amplifier 98 to effect the phase of the radio frequency signals provided at the radio frequency output 110 in accordance with the phase command. Although in-phase and quadrature channels are discussed herein, other channel types can be utilized.

In some embodiments, the phase verification circuit 36 receives digital data representative of the power detected by the radio frequency power detector 44 associated with a the radio frequency output 110 coupled to the antenna element 20. The phase verification circuit 46 uses the digital data representative of the power detected by the radio frequency power detector 44 to determine phase error and/or other operation errors. In some embodiments, the phase verification circuit 46 uses the digital data to determine a phase parameter associated with the phase shifter 122 and compares it to the phase associated with the digital phase command used to provide gain control signals to the digital-to-analog converters 114. In some embodiments, the phase verification circuit 46 uses the digital data to determine channel power response over a spectrum of phase commands and compares it to the expected channel power response. In some embodiments, the phase verification circuit 46 uses the digital data and direct current measurements provided by the direct current measurement circuit 38 to determine a phase parameter associated with the phase shifter 122 and compares it to the phase associated with the digital phase command provided to the digital-to-analog converters 114. In some embodiments, the phase verification circuit 46 uses the direct current measurements provided by direct current measurement circuit data to determine a phase parameter associated with the phase shifter 122 and compares it to the phase associated with the digital phase command provided to the digital-to-analog converters 114.

The positive in-phase amplifier 92, the negative in-phase amplifier 94, the positive quadrature phase amplifier 96, and the negative quadrature amplifier 98 are variable gain control radio frequency amplifiers in some embodiments. The positive in-phase amplifier 92, the negative in-phase amplifier 94, the positive quadrature phase amplifier 96, and the negative quadrature amplifier 98 can cooperate to provide a phase parameter in all four quadrants (e.g., 0-360 degrees). When DC current is zero for a selected one or more of positive in-phase amplifier 92, negative in-phase amplifier 94, positive quadrature phase amplifier 96, and negative quadrature amplifier 98, there is full attenuation or no signal. By measuring current associated with each of the positive in-phase amplifier 92, the negative in-phase amplifier 94, the positive quadrature phase amplifier 96, and the negative quadrature amplifier 98, the quadrant can be determined using trigonometric principles.

Figure 3:
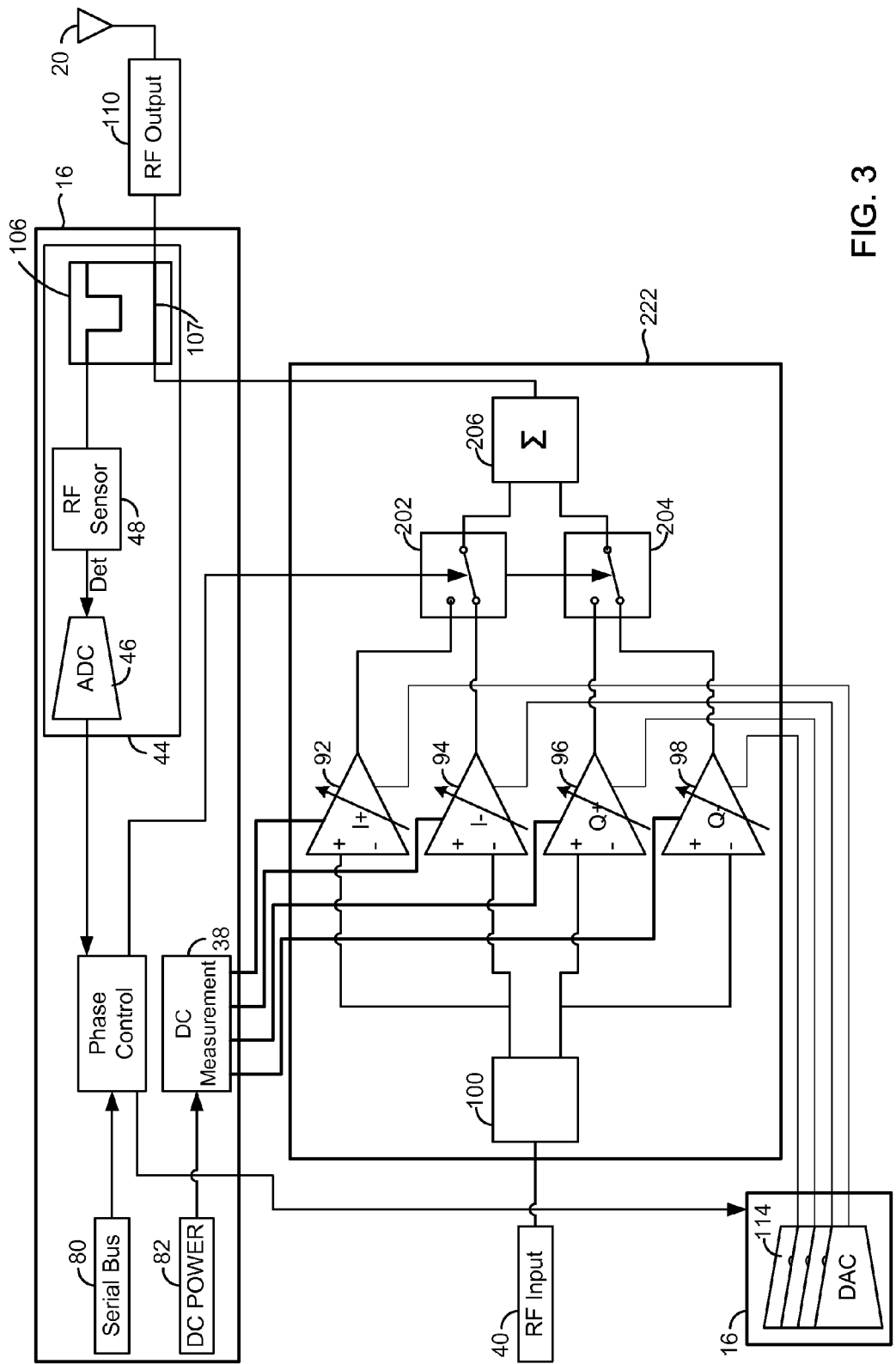
FIG. 3 is a more detailed block diagram of one of the phase shifters illustrated in FIG. 1 and the phase verification circuit illustrated in FIG. 1 in accordance with some embodiments of the inventive concepts disclosed herein.

With reference to FIG. 3, a phase shifter 222 is similar to the phase shifter 122 and can be used as the phase shifter 22 in system 10 (FIG. 1). The phase shifter 222 includes a switching element 202, a switching element 204, and a summer 206 instead of summer 104 (FIG. 2). The switching element 202 chooses an output from one of the positive in-phase amplifier 92, and the negative in-phase amplifier 94 for receipt by the summer 206, and the switching element 204 chooses an output from one of the positive quadrature amplifier 98, and the negative quadrature amplifier 96 for receipt by the summer 206. The summer 206 provides the combined signal to the conductor 107. The switch elements 202 and 204 prevent the non-chosen amplifier from affecting the output from the summer 206. The summer 206 is a passive summer or an active summer. The phase shifter 222 can replace the phase shifter 122 in FIG. 2A. A similar phase shifter 222 can replace the phase shifter 122 in FIG. 2B.

Figure 4:
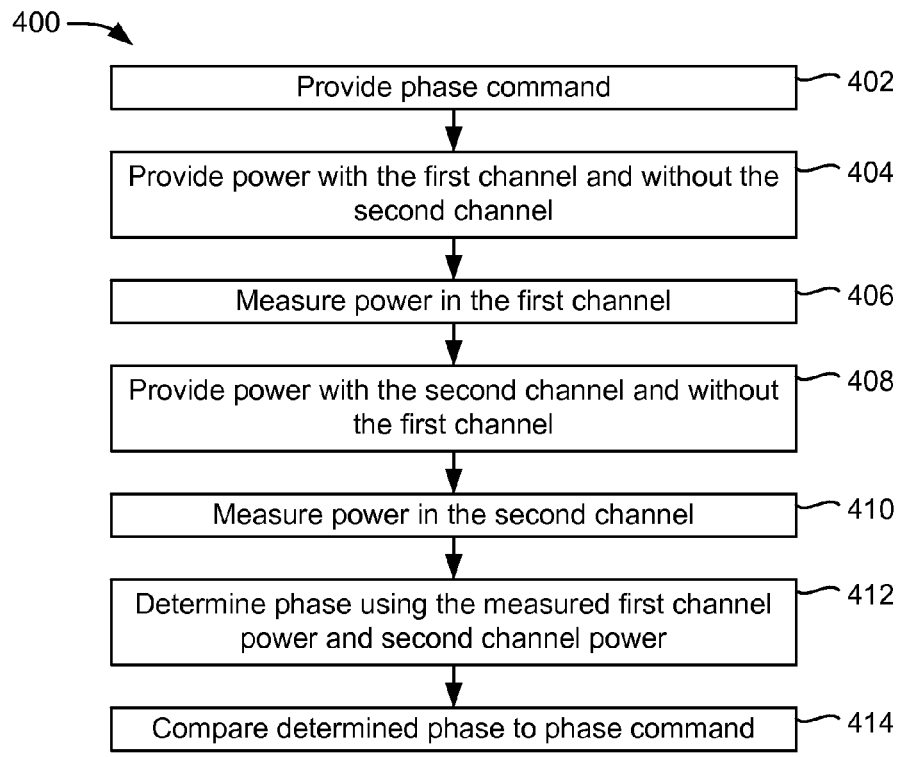
FIG. 4 is a diagram of an operational flow for phase verification in the system illustrated in FIG. 1 in accordance with some embodiments of the inventive concepts disclosed herein.

With reference to FIGS. 2A-B and 4, the system 10 can utilize an operational flow 400. At an operation 402, a phase can be set for one or more antenna elements 20 using a digital phase shift command from the beam control module 16. The digital phase shift command is used to set the phase for the I-channel and Q channel by providing amplifier gain signals via the digital to analog converters 114.

At an operation 404, the quadrature channel is turned off either via the switch element 202 (FIG. 3) under control of the beam control module 16, by setting the gain for both the positive quadrature amplifier 96, and the negative quadrature amplifier 98 to zero, or by terminating power to both the positive quadrature amplifier 96, and the negative quadrature amplifier 98 to zero using the respective conductors 112, or combinations thereof in some embodiments. Alternatively, other techniques can be used to disable or remove signals from the positive quadrature amplifier 96, and the negative quadrature amplifier 98. At operation 404, the radio frequency signal is provided with the in-phase channel only.

At an operation 406, power is measured in the in-phase channel. The power can be measured or inferred by sensing the direct current power using the direct current measurement circuit 38 or by measuring radio frequency power using the radio frequency power sensor 44.

At operation 408, the I channel is turned off either via the switch element 202 (FIG. 3) under control of the beam control module 16, by setting the gain for both the positive in-phase amplifier 92 and the negative in phase amplifier 94 to zero, or by terminating power to both the positive in-phase amplifier 92 and the negative in-phase amplifier 94 to zero using respective conductors 112, or combinations thereof in some embodiments. Alternatively, other techniques can be used to disable or remove signals from the positive in-phase amplifier 92, and the negative in-phase amplifier 94. The radio frequency signal is provided with the quadrature channel only.

At an operation 410, power is measured in the in-phase channel. The power can be measured by sensing the direct current power using the direct current measurement circuit 38 or by measuring radio frequency power using the radio frequency power sensor 44.

At an operation 412, the phase is calculated from the measured power in the I channel and the measured power in the Q channel. Phase=ARC TAN $P_Q/P_I$ where Phase is the angle in degrees; $P_Q$ is the power derived from direct current measurement circuit 38 or measured by the radio frequency detector 44 in operation 406; and $P_I$ is the power derived from the direct current measurement circuit 38 or measured by the radio frequency detector 44 in operation 410. In some embodiments, other methods of determining phase from I and Q channel measurements are used, including, but not limited to other trigonometric functions or using empirically determined look-up table data. At an operation 414, the phase calculated in operation 412 can be compared to the phase associated with the digital phase command to determine a phase error. Operations 412 and 414 can be performed by the beam control module 16 (e.g., the phase verification circuit 36).

Figure 5:
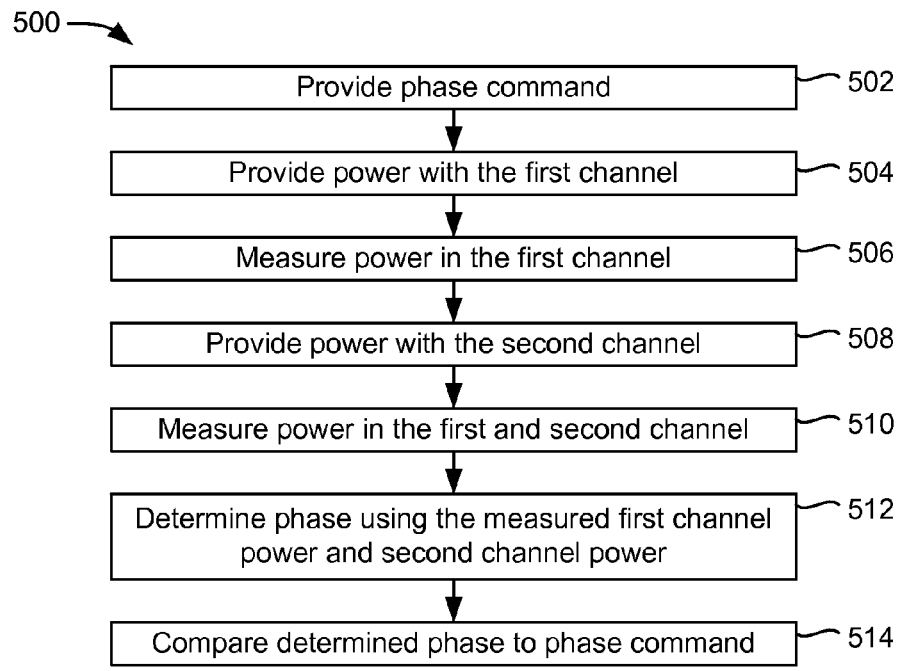
FIG. 5 is a diagram of an operational flow for phase verification in the system illustrated in FIG. 1 in accordance with some embodiments of the inventive concepts disclosed herein.

With reference to FIGS. 2A-B and 5, the system 10 can utilize an operational flow 500. At an operation 502, a phase can be set for one or more antenna elements 20 using a digital phase shift command. The digital phase shift command is used to set the phase for the I channel and Q channel by providing amplifier gain signals via the digital to analog converters 114. Amplifier gain signals can be negative (e.g., attenuative) or positive (e.g., amplifying).

At operation 504, the quadrature channel is turned off either via the switch element 204 (FIG. 3) under control of the beam control module 16, by setting the gain for both the positive quadrature amplifier 96, and the negative quadrature amplifier 98 to zero, or by terminating power to both the positive quadrature amplifier 96, and the negative quadrature amplifier 98 to zero using the respective conductors 112, or combinations thereof in some embodiments. Alternatively, other techniques can be used to disable or remove signals from the positive quadrature amplifier 96 and the negative quadrature amplifier 98. The radio frequency signal is provided with the in-phase channel only.

At an operation 506, power is measured in the in-phase channel. The power can be measured by sensing the direct current power using the direct current measurement circuit 38 or by measuring radio frequency power using the radio frequency power sensor 44.

At operation 508, the Q channel is turned on and the radio frequency signal is provided with the in-phase channel and quadrature channel.

At an operation 510, power is measured. The power can be measured by sensing the direct current power using the direct current measurement circuit 38 or by measuring radio frequency power using the radio frequency power sensor 44.

At an operation 512, the phase is calculated from the measured power in the I channel and the power measured in both channels. Phase=ARCOS $P_I/P_T$ where Phase is the phase angle in degrees; $P_1$ is the power derived from the direct current measurement circuit 38 or measured by the radio frequency detector 44 in operation 506; and $P_T$ is the power derived from the direct current measurement circuit 38 or measured by the radio frequency detector 44 in operation 510. At an operation 514, the phase calculated in operation 512 can be compared to the phase associated with the digital phase command.

In some embodiments, the in phase channel is turned off using similar techniques to operation 504 and the output of the Q channel is determined using an operation similar to operation 506. The phase is calculated from the measured power in the Q channel and the power measured in both channels. Phase=ARCSINE $P_Q/P_T$ where Phase is the phase angle in degrees; $P_I$ is the power from the direct current measurement circuit 36 or the radio frequency detector 44 with the quadrature channel off; and $P_T$ is the power from the direct current measurement circuit 36 or the radio frequency detector 44 in operation 510. Operations 512 and 514 can be performed by the beam control module 16 (e.g., the phase verification circuit 36).

The quadrant for the phase parameter can be determined by identifying which of the positive in-phase amplifier 92, the negative in-phase amplifier 94, the positive quadrature phase amplifier 96, and the negative quadrature amplifier 98 are on or have a gain signal. For example, if the positive in-phase amplifier 92, and the negative quadrature amplifier 98 are on or have a gain signal, the phase is in quadrant 4. For example, if the negative in-phase amplifier 94, and the negative quadrature amplifier 98 are on, the phase is in quadrant 3. For example, if the positive in-phase amplifier 92 and the positive quadrature amplifier 96 are on, the phase in in quadrant 1. For example, if the negative in-phase amplifier 94 and the positive quadrature amplifier 96 are on, the phase is in quadrant 3. The phase command signal can be used to determine which of the positive in-phase amplifier 92, the negative in-phase amplifier 94, the positive quadrature phase amplifier 96, and the negative quadrature amplifier 98 are on in some embodiments. The direct current measurements by the direct current measurement circuit 38 can be used to determine which of the positive in-phase amplifier 92, the negative in-phase amplifier 94, the positive quadrature phase amplifier 96, and the negative quadrature amplifier 98 are on in some embodiments.

Figure 6:
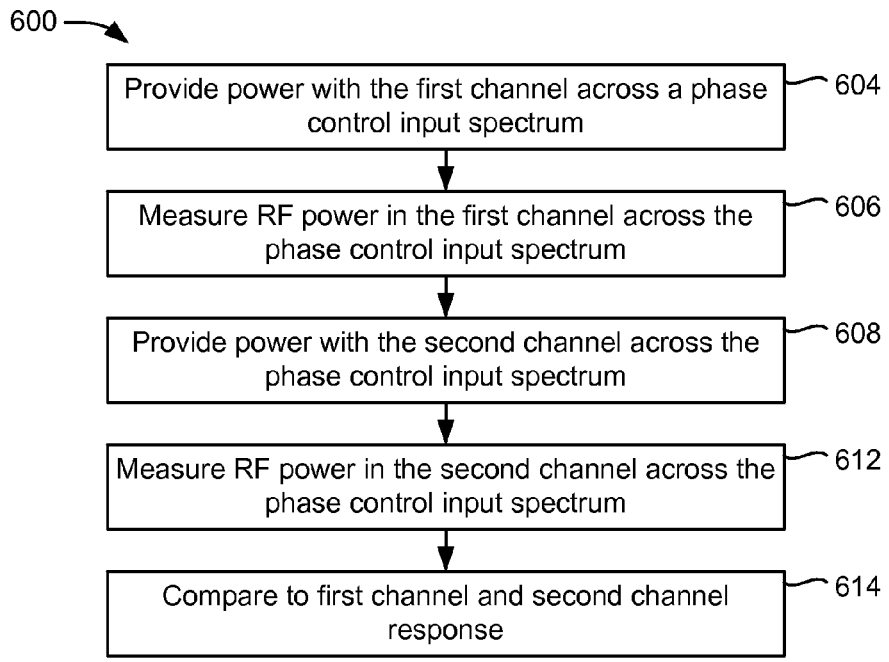
FIG. 6 is a diagram of an operational flow for phase shifter operation verification in the system illustrated in FIG. 1 in accordance with some embodiments of the inventive concepts disclosed herein.

With reference to FIGS. 2 and 6, the system 10 can utilize an operational flow 600. At an operation 604, a phase can be set across a spectrum of power inputs for one or more antenna elements 20 using a digital phase shift command. The digital phase shift command is used to set the phase for the I-channel and Q channel by providing amplifier gain signals via the digital to analog converters 114.

At operation 604, the quadrature channel is turned off either via the switch element 204 under control of the beam control module 16, by setting the gain for both the positive quadrature amplifier 96 and the negative quadrature amplifier 98 to zero, or by terminating power to both the positive quadrature amplifier 96, and the negative quadrature amplifier 98 to zero using the respective conductors 112, or combinations thereof in some embodiments. Alternatively, other techniques can be used to disable or remove signals from the positive quadrature amplifier 96 and the negative quadrature amplifier 98. The radio frequency signal is provided with the in-phase channel only across the spectrum of phase values.

At an operation 606, power is measured in the in-phase channel across the spectrum of phase values. The spectrum can include 2, 4, 6, 8, 10, 20, 40, etc. different phase commands (e.g., the phase values being at every 1 degree, every 10 degrees, every 45 degrees, etc.). The power can be measured by sensing the direct current power using direct the current measurement circuit 38 or by measuring radio frequency power using the radio frequency power sensor 44.

At operation 608, the in-phase channel is turned off either via the switch element 202 (FIG. 3) under control of the beam control module 16, by setting the gain for both the positive in-phase amplifier 92, and the negative in-phase amplifier 94 to zero, or by terminating power to both the positive in-phase amplifier 92 and the negative in-phase amplifier 94 to zero using the respective conductors 112, or combinations thereof in some embodiments. Alternatively, other techniques can be used to disable or remove signals from the positive in-phase amplifier 92 and the negative in-phase amplifier 94. The radio frequency signal is provided with the quadrature channel only across the spectrum of phase values.

At an operation 612, power is measured in the-phase channel in across the spectrum of phase values. The spectrum can include 2, 4, 6, 8, 10, 20, 40, etc. phase positions. In some embodiments, the spectrum in operation 612 is the same as the spectrum of operation 608. The power can be measured by sensing the direct current power using the direct current measurement circuit 38 or by measuring radio frequency power using the radio frequency power sensor 44.

At an operation 614, the phase response for the in-phase channel and quadrature channel are compared. Matching phase responses indicate a properly working phase shifter 122. Various curve matching, curve fitting, polynomial matching algorithms can be used to compare responses. Operation 614 can be performed by the beam control module 16 (e.g., phase verification circuit 36).

Figure 7:
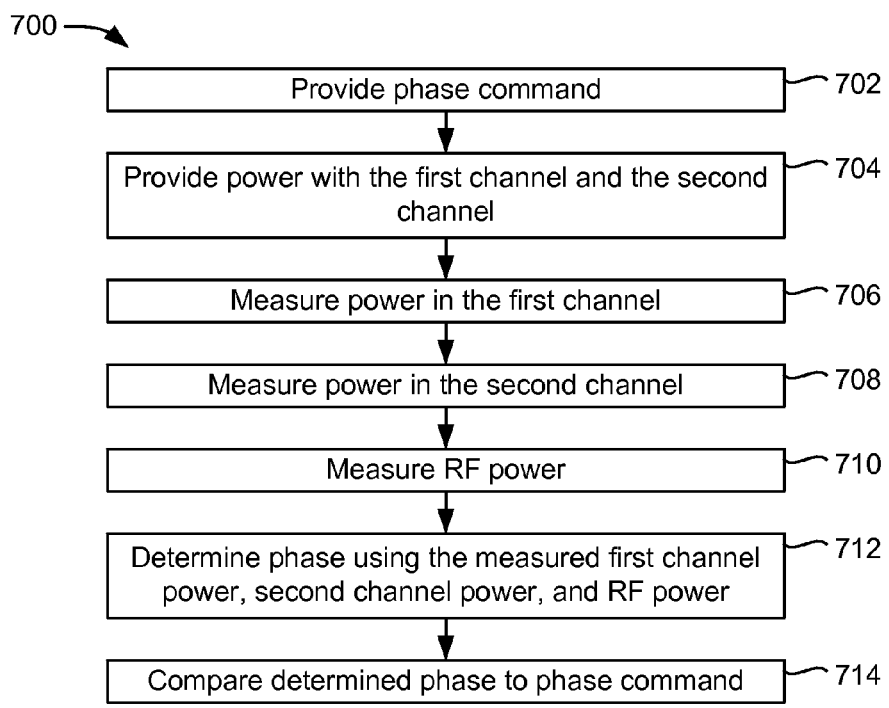
FIG. 7 is a diagram of an operational flow for phase verification in the system illustrated in FIG. 1 in accordance with some embodiments of the inventive concepts disclosed herein.

With reference to FIGS. 2A-B and 7, the system 10 can utilize an operational flow 700. At an operation 702, a phase can be set for one or more antenna elements 20 using a digital phase shift command. The digital phase shift command is used to set the phase for the in-phase channel and quadrature channel by providing amplifier gain signals via the digital to analog converters 114.

At operation 704, the radio frequency signal is provided using the in-phase channel and the quadrature phase channel. At an operation 706, power is measured in the in-phase channel. The power can be measured by sensing the direct current power using the direct current measurement circuit 38 using the conductors 112 that are associated with the positive in-phase amplifier 92 and the negative in-phase amplifier 94.

At operation 708, power is measured in the quadrature channel. The power can be measured by sensing the direct current power using the direct current measurement circuit 38 using the conductors 112 that are associated with the positive quadrature amplifier 96 and the negative quadrature amplifier 98. Operations 706 and 708 are performed simultaneously in some embodiments.

At an operation 710, power is measured using the radio frequency power sensor 44. Operation 710 is performed simultaneously with operations 706 and 708 in some embodiments.

At an operation 712, the phase is calculated from the measured power in operations 706, 708 and 710. Values of power from operations 706 and 708 are converted to be compatible with levels of power determined in operation 710 in some embodiments. Phase can be calculated and compared applying trigonometry to the power from operations 706 and 708, power from operations 708 and 710, and/or the power from operations 706 and 710. The calculated phase or phases are compared to the phase associated with phase command in some embodiments. At an operation 714, the phase calculated in operation 712 can be compared to the phase associated with the digital phase command. Operations 712 and 714 can be performed by the beam control module 16 (e.g., the phase verification circuit 36).

Figure 8:
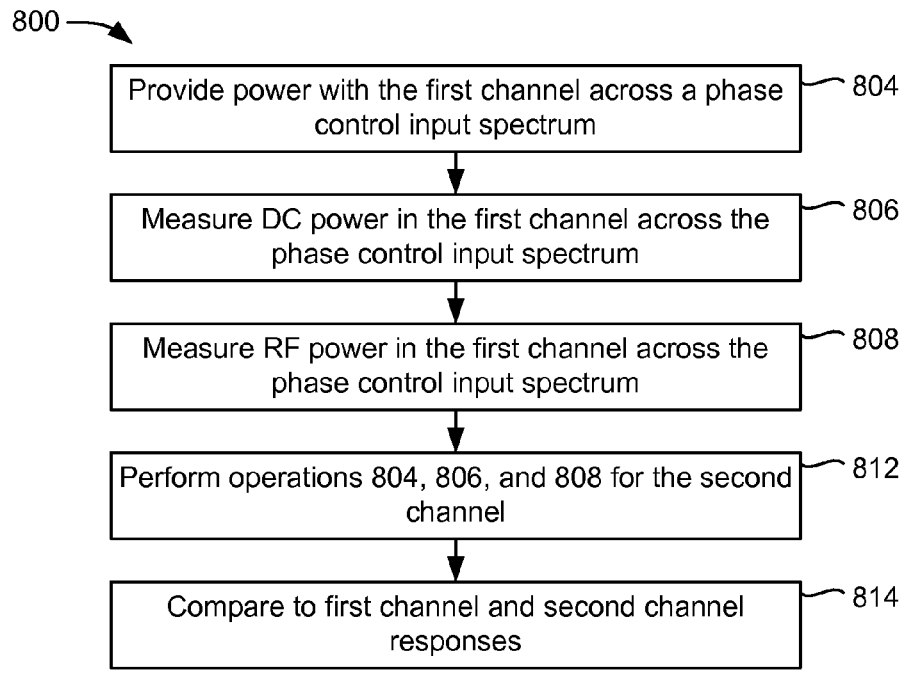
FIG. 8 is a diagram of an operational flow for phase shifter operation verification in the system illustrated in FIG. 1 in accordance with some embodiments of the inventive concepts disclosed herein.

With reference to FIGS. 2A-B and 8, the system 10 can utilize an operational flow 800. At an operation 804, a phase can be set across a spectrum for one or more antenna elements 20 using a digital phase shift command. The digital phase shift command is used to set the phase for the in-phase channel and quadrature channel by providing amplifier gain signals via the digital to analog converters 114.

At operation 804, the quadrature channel is turned off either via the switch element 204 under control of the beam control module 16, by setting the gain for both the positive quadrature amplifier 96 and the negative quadrature amplifier 98 to zero, or by terminating power to both the positive quadrature amplifier 96 and the negative quadrature amplifier 98 to zero using respective conductors 112, or combinations thereof in some embodiments. Alternatively, other techniques can be used to disable or remove signals from the positive quadrature amplifier 96 and the negative quadrature amplifier 98. The radio frequency signal is provided with the in-phase channel only across the spectrum of phase values.

At operation 806, power is measured in the-phase channel in across the spectrum of phase values. The spectrum can include 2, 4, 6, 8, 10, 20, 40, etc. degree positions. The power can be measured by sensing the direct current power using the direct current measurement circuit 38.

At an operation 808, the power is measured using the radio frequency power detector 44 in the in-phase channel in across the spectrum of phase values. Operations 806 and 808 can be performed simultaneously. In some embodiments, operation 806 is not performed. In some embodiments, operation 808 is not performed.

At operation 812, operations similar to operations 804-808 are performed for the quadrature channel. At an operation 814, the quadrature channel response and the in-phase channel response are compared. Matching phase responses in both channels indicate a properly working phase shifter 122. Operation 814 can be performed by beam control module 16 (e.g., phase verification circuit 36).

Figure 9:
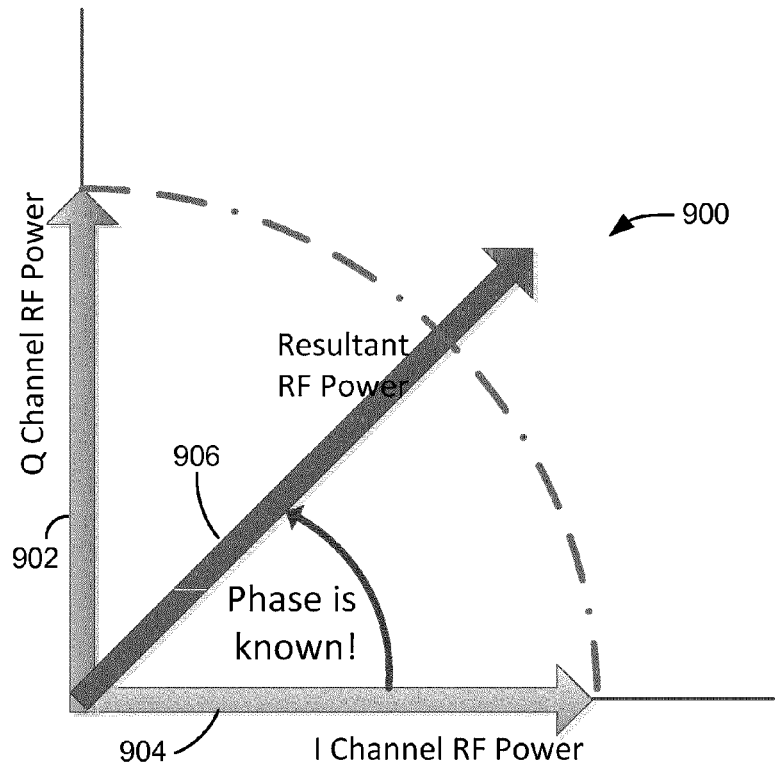
FIG. 9 is a chart showing phase with respect to channel power for the phase shifter illustrated in FIG. 2 in accordance with some embodiments of the inventive concepts disclosed herein.

With reference to FIG. 9, a chart 900 includes an X axis 902 representing in-phase channel power and a Y axis 904 representing quadrature power. A vector 906 is a resultant vector representing phase and amplitude. Operational flows 400, 500 and 700 can use chart 900 to determine phase in some embodiments.

Figure 10:
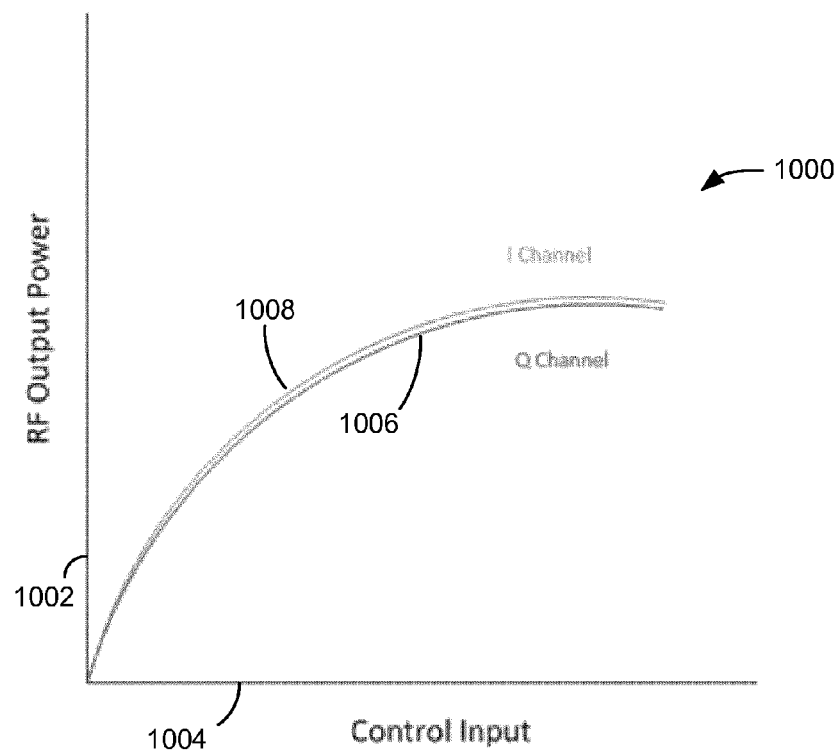
FIG. 10 is a chart showing radio frequency output power with respect to control input power for two channels used in the phase shifter illustrated in FIG. 2 in accordance with some embodiments of the inventive concepts disclosed herein.

With reference to FIG. 10, a chart 1000 includes an X axis 1004 representing phase input and a Y axis 1002 representing radio frequency output power. A line 1006 represents the phase to power response for the quadrature channel, and a line 1006 represents the phase to power response for the in-phase channel. The response of lines 1006 and 10008 can be determined using operational flows 600 and 800. The close matching of lines 10006 and 1008 indicates proper operation of phase shifter 122.

Figure 11:
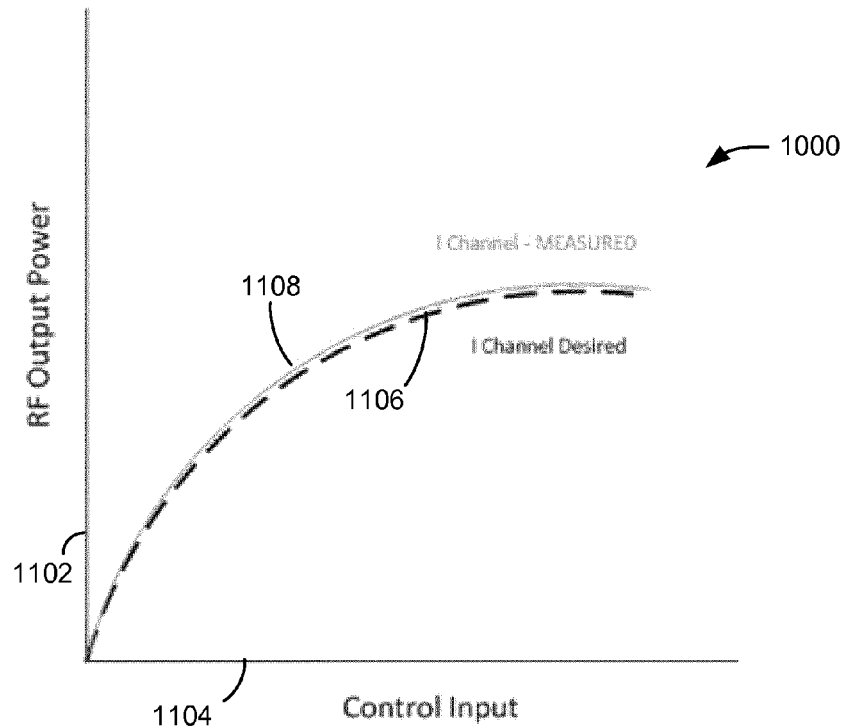
FIG. 11 is a chart showing channel output power with respect to desired power for a healthy phase shifter illustrated in FIG. 2 in accordance with some embodiments of the inventive concepts disclosed herein.

With reference to FIG. 11, a chart 1100 includes an X axis 1104 representing phase control input and a Y axis 1102 representing radio frequency output power in an in-phase channel or a quadrature channel. A line 1106 represents the desired phase to power response and a line 1108 represents the measured phase to power response. The close identity of lines 1106 and 1108 indicates a healthy phase shifter 122. Line 1108 can be created from measurements associated with operational flows 600 or 800. In some embodiments, responses for both channels or combined channels can be compared to expected responses.

Figure 12:
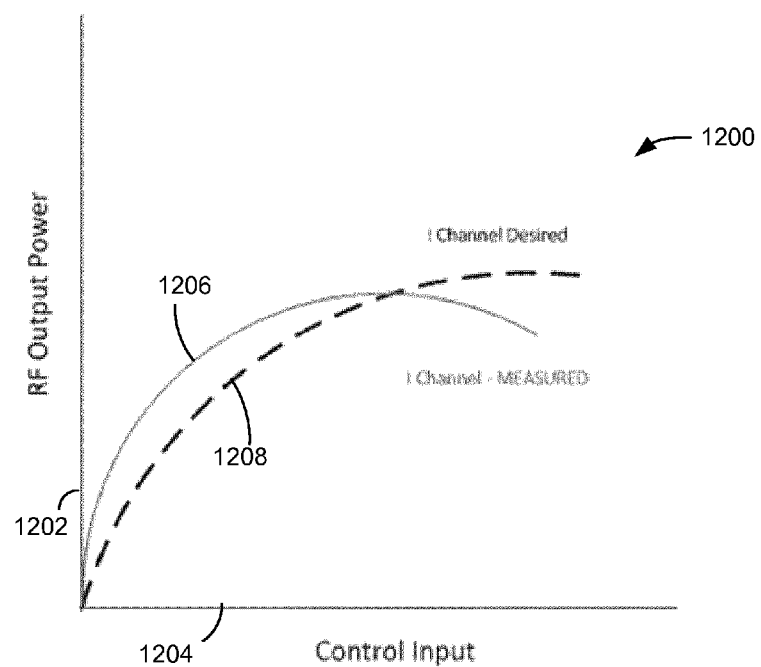
FIG. 12 is a chart showing channel output power with respect to desired power for an unhealthy phase shifter illustrated in FIG. 2 in accordance with some embodiments of the inventive concepts disclosed herein.

With reference to FIG. 12, a chart 1200 includes an X axis 1204 representing phase control input and a Y axis 1202 radio frequency output power in an in-phase channel or a quadrature channel. A line 1208 represents the desired phase to power response, and a line 1206 represents the measured phase to power response. The unmatched nature of lines 1106 and 1108 indicates a non-healthy phase shifter 122.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

The present disclosure contemplates methods, systems and program products on any machine-readable media for accomplishing various operations. Embodiments of the inventive concepts disclosed herein may be implemented using existing computer operational flows, or by a special purpose computer operational flows for an appropriate system, incorporated for this or another purpose, or by a hardwired system. Embodiments within the scope of the inventive concepts disclosed herein include program products comprising machine-readable media for carrying or having machine-executable instructions or data structures stored thereon. Such machine-readable media can be any available media that can be accessed by a special purpose computer or other machine with an operational flow. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with an operational flow. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a special purpose computer, or special purpose operational flowing machines to perform a certain function or group of functions.

What is claimed is:

1. An antennae system, comprising:
a plurality of antenna elements;
a plurality of phase shifters comprising respective power amplifier circuits, each of the respective power amplifier circuits comprising a first inverted variable gain power amplifier, a second inverted variable gain power amplifier, a first non-inverted variable gain power amplifier, a second non-inverted variable gain power amplifier, the plurality of phase shifters associated with the plurality of antenna elements;
a plurality of power sensors being in communication with the plurality of phase shifters, each of the plurality of power sensors being associated with a respective phase shifter of the plurality of phase shifters and being configured to detect power associated with a respective power amplifier circuit of the power amplification circuits; and a control circuit configured to calculate a phase parameter associated with each of the plurality of phase shifters using the power detected by the plurality of power sensors, wherein the control circuit is configured to:
(a). turn off the first inverted variable gain power amplifier and the first non-inverted variable gain power amplifier for each of the phase shifters, and receive a first power parameter of power provided to each of the power amplification circuits at a phase command with the first inverted variable gain power amplifier and the first non-inverted variable gain power amplifier turned off;
(b). turn on the first inverted variable gain power amplifier and the first non-inverted variable gain power amplifier for each of the phase shifters, and receive a second power parameter of the power provided to each of the power amplification circuits at a phase command with the first inverted variable gain power amplifier and the first non-inverted variable gain power amplifier turned on; and
(c). determine a phase parameter for each phase shifter using the first power parameter and the second power parameter from each respective power sensor.

2. The system of claim 1, wherein the plurality of power sensors are integrated on an integrated circuit associated with the power amplifier circuits of the plurality of phase shifters.

3. The system of claim 1, further comprising a conductor between the antenna elements and the control circuit wherein the plurality of power sensors comprise radio frequency detectors in communication with the conductor.

4. The system of claim 1, wherein the first inverted variable gain power amplifier is an in-phase amplifier, and second inverted variable gain power amplifier is a quadrature amplifier.

5. The system of claim 1, wherein the control circuit compares a phase command to the phase parameter to detect a phase error.

6. The system of claim 5, wherein the phase parameter is between 0 and 360 degrees.

7. The system of claim 6, wherein the amplifier circuit comprises two in-phase channel amplifiers and two quadrature channel amplifiers.

8. The system of claim 7, wherein the control circuit turns off the in-phase channel amplifiers by operation of a switch at outputs of the in-phase channel amplifiers.

9. The system of claim 7, wherein the control circuit turns off the in-phase channel amplifiers by removing direct current power supplied to the in-phase channel amplifiers.

10. A method of verifying phase associated with an antenna element in an antennae array, the method comprising:
providing a phase shift command to a phase shifter associated with an antenna element, the phase shifter comprises a first amplifier channel and a second amplifier channel;
providing a first RF signal to the antenna element using the first amplifier channel comprising an inverted in phase variable gain power amplifier and an inverted quadrature variable gain power amplifier in accordance with the phase shift command without providing power to the second amplifier channel comprising a non-inverted in-phase variable gain power amplifier and a non inverted quadrature variable gain power amplifier;
measuring first power provided to the antenna element using the first amplifier channel with a power sensor and providing a first power parameter;
providing a second RF signal to the antenna element using only the second amplifier channel or both the first amplifier channel and the second amplifier in accordance with the phase shift command;
measuring second power provided to the antenna element using only the second amplifier channel or using both the first amplifier channel and the second amplifier with the power sensor and providing a second power parameter; and
determining a phase parameter from the first power parameter and the second power parameter to verify phase associated with the antenna element.

11. The method of claim 9 further comprising determining a phase quadrant to the phase parameter.

12. The method of claim 11 wherein the first power and the second power are measured from a direct current bus in each respective channel.

13. The method of claim 11 wherein the first amplifier channel and the second amplifier channel together comprise four power amplifiers each having outputs coupled to a passive summer, the passive summer being coupled to the power sensor.

14. The method of claim 11 wherein the first amplifier channel and the second amplifier channel together comprise four power amplifiers, wherein outputs of the four power amplifiers are coupled to a pair of switches, the pair of switches being coupled to the power sensor through a passive summer.

15. The method of claim 10 wherein the power sensor is a radio frequency detector coupled to a conductive path coupled to the antenna element.

16. The method of claim 10 wherein the phase shifter is a vector modulator phase shifter.

17. A method of verifying phase shifter operation associated with an antenna element in an electronically scanned antennae array, the method comprising:
measuring first power from an amplification circuit comprising a first amplifier channel and a second amplifier channel, wherein the first power is measured when a first RF signal is provided to the antenna element using the first amplifier channel without providing power from the second amplifier channel, wherein the first power is measured for a plurality of first phase shift commands, wherein the first power is measured with a power sensor;
measuring second power from the amplification circuit wherein the second power is measured when a second RF signal is provided to the antenna element using the second amplifier channel without providing power from the first amplifier channel, wherein the second power is measured for a plurality of second phase shift commands, wherein the second power is measured with the power sensor; and
comparing the first power to the second power across a spectrum of the first phase shift commands and the second phase shift commands to verify phase shifter operation.

18. The method of claim 17 wherein the first phase shifter commands are identical to the second phase shifter commands.

19. The method of claim 18 further comprising determining an operational error by determining a non-matching response of the first power and the second power to the spectrum.

20. The method of claim 17, wherein the power sensor is a radio frequency detector or a direct current sensor circuit.

* * * * *